(12) United States Patent
Utomo et al.

(10) Patent No.: US 9,190,520 B2
(45) Date of Patent: Nov. 17, 2015

(54) STRAINED FINFET WITH AN ELECTRICALLY ISOLATED CHANNEL

(71) Applicant: International Business Machines Corporation, Armonk, NY (US)

(72) Inventors: Henry K. Utomo, Newburgh, NY (US); Kangguo Cheng, Schenectady, NY (US); Ramachandra Divakaruni, Ossining, NY (US); Dechao Guo, Fishkill, NY (US); Myung-Hee Na, Lagrangeville, NY (US); Ravikumar Ramachandran, Pleasantville, NY (US); Kern Rim, Yorktown Heights, NY (US); Huiling Shang, Yorktown Heights, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/481,146

(22) Filed: Sep. 9, 2014

(65) Prior Publication Data

US 2014/0377924 A1     Dec. 25, 2014

Related U.S. Application Data

(62) Division of application No. 13/737,089, filed on Jan. 9, 2013, now Pat. No. 8,928,086.

(51) Int. Cl.
*H01L 21/336*     (2006.01)
*H01L 29/78*     (2006.01)
(Continued)

(52) U.S. Cl.
CPC .... *H01L 29/7855* (2013.01); *H01L 21/823431* (2013.01); *H01L 29/0847* (2013.01); *H01L 29/1054* (2013.01); *H01L 29/66545* (2013.01); *H01L 29/66795* (2013.01); *H01L 29/785* (2013.01); *H01L 29/7848* (2013.01)

(58) Field of Classification Search
CPC .............................................. H01L 21/823431
USPC .......................................................... 438/284
See application file for complete search history.

(56) References Cited

U.S. PATENT DOCUMENTS 7,229,884 B2    6/2007    Park
7,309,635 B2    12/2007    Park
(Continued)

OTHER PUBLICATIONS

International Search Report/Written Opinion dated May 2, 2014 PCT/US2014/010424.

*Primary Examiner* — Chandra Chaudhari
(74) *Attorney, Agent, or Firm* — Scully, Scott, Murphy & Presser, P.C.

(57) ABSTRACT

A fin structure includes an optional doped well, a disposable single crystalline semiconductor material portion, and a top semiconductor portion formed on a substrate. A disposable gate structure straddling the fin structure is formed, and end portions of the fin structure are removed to form end cavities. Doped semiconductor material portions are formed on sides of a stack of the disposable single crystalline semiconductor material portion and a channel region including the top semiconductor portion. The disposable single crystalline semiconductor material portion may be replaced with a dielectric material portion after removal of the disposable gate structure or after formation of the stack. The gate cavity is filled with a gate dielectric and a gate electrode. The channel region is stressed by the doped semiconductor material portions, and is electrically isolated from the substrate by the dielectric material portion.

18 Claims, 15 Drawing Sheets

(51) Int. Cl.
    *H01L 21/8234* (2006.01)
    *H01L 29/08* (2006.01)
    *H01L 29/10* (2006.01)
    *H01L 29/66* (2006.01)

(56) References Cited

U.S. PATENT DOCUMENTS

| | | | |
|---|---|---|---|
| 7,648,883 B2 | 1/2010 | Park | |
| 7,692,254 B2 | 4/2010 | Anderson et al. | |
| 7,851,865 B2 | 12/2010 | Anderson et al. | |
| 8,043,920 B2 | 10/2011 | Chan et al. | |
| 8,138,053 B2 | 3/2012 | Utomo et al. | |
| 8,283,653 B2 | 10/2012 | Pillarisetty et al. | |
| 8,994,123 B2 * | 3/2015 | Asenov et al. | 257/411 |
| 2004/0227181 A1 | 11/2004 | Yeo et al. | |
| 2005/0077510 A1 | 4/2005 | Chu et al. | |
| 2007/0018201 A1 | 1/2007 | Specht et al. | |
| 2008/0237636 A1 | 10/2008 | Jin et al. | |

* cited by examiner

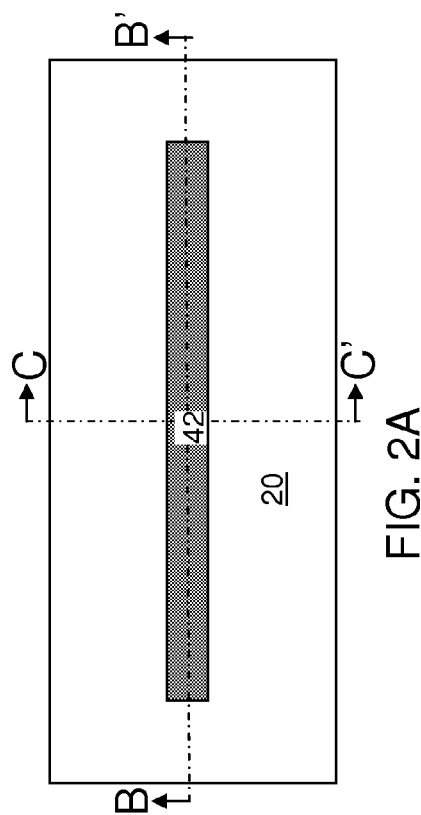
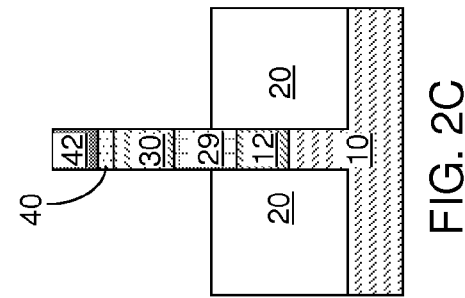
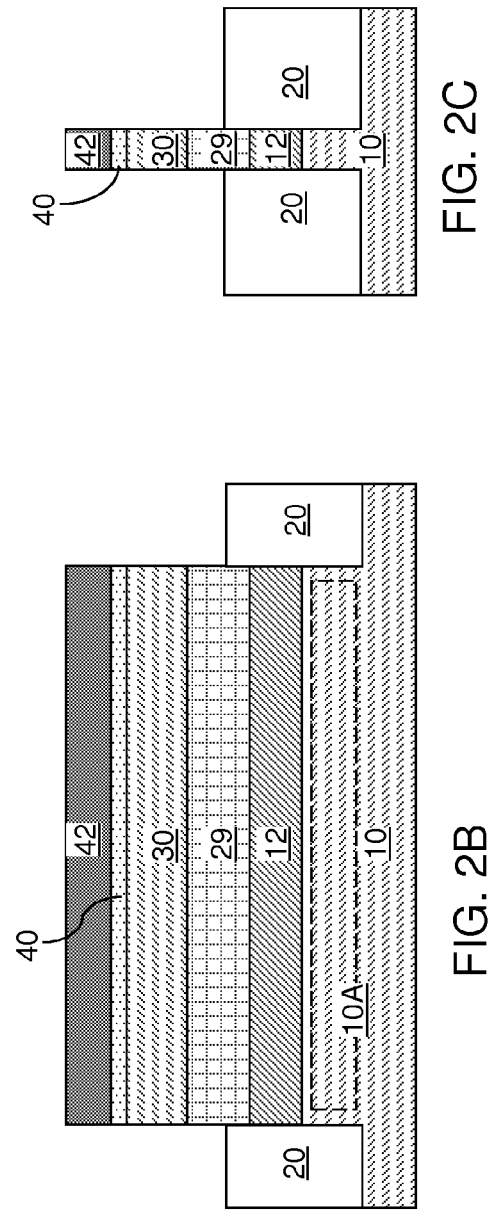

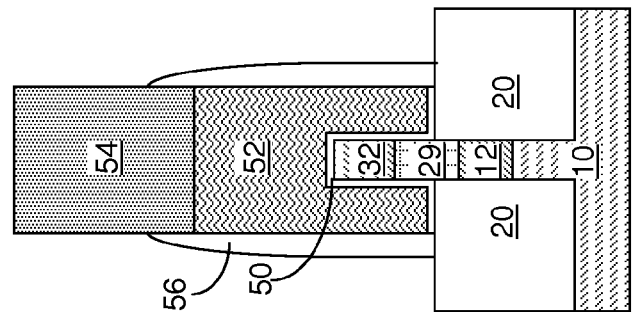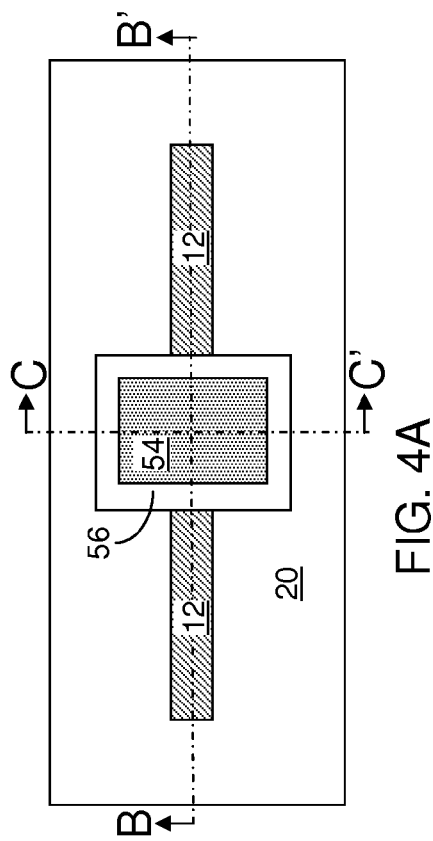
FIG. 4A
FIG. 4B
FIG. 4C

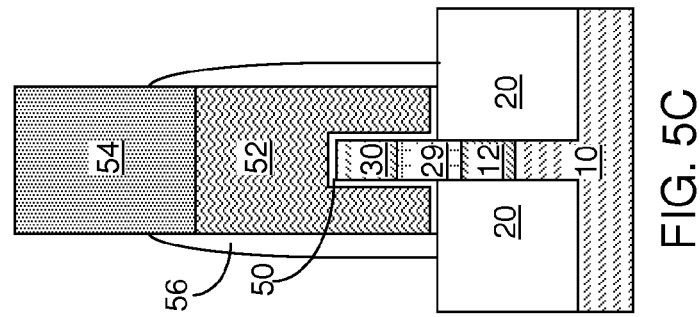
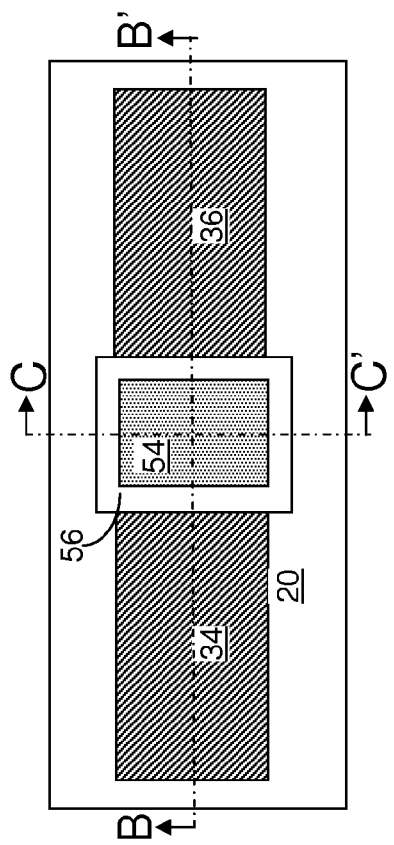
FIG. 5A
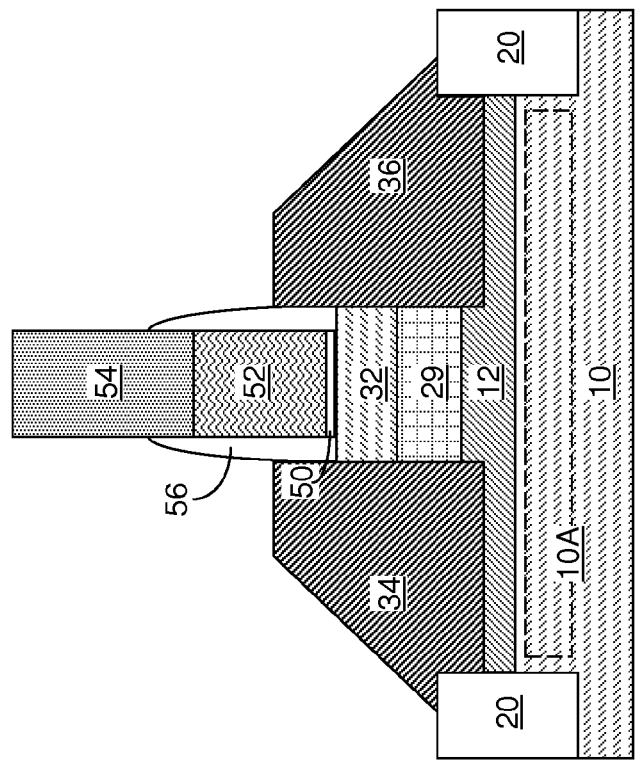
FIG. 5B
FIG. 5C

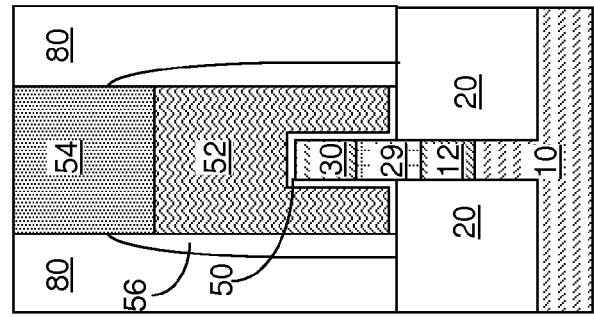
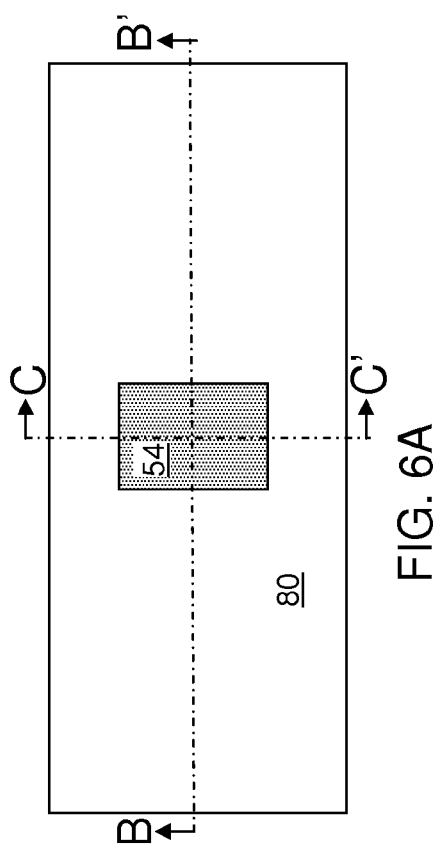
FIG. 6A
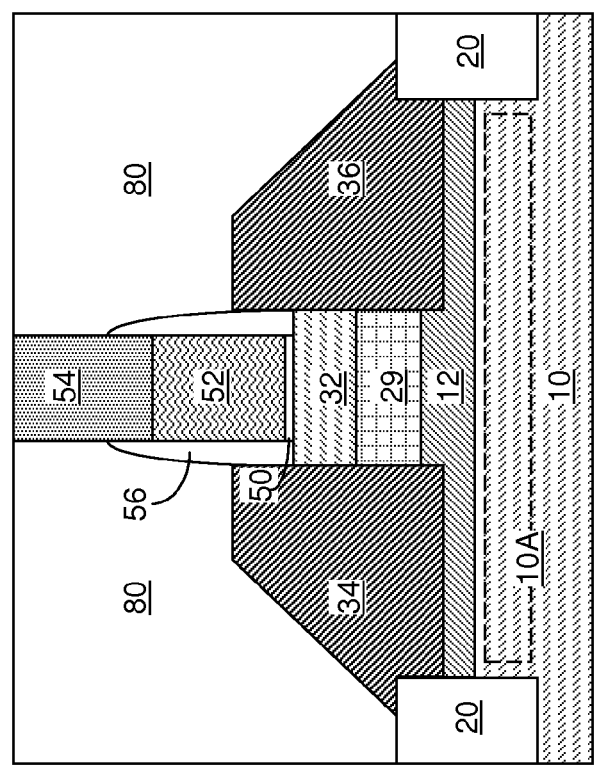
FIG. 6B
FIG. 6C

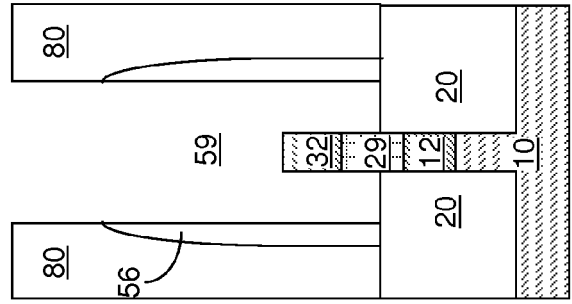
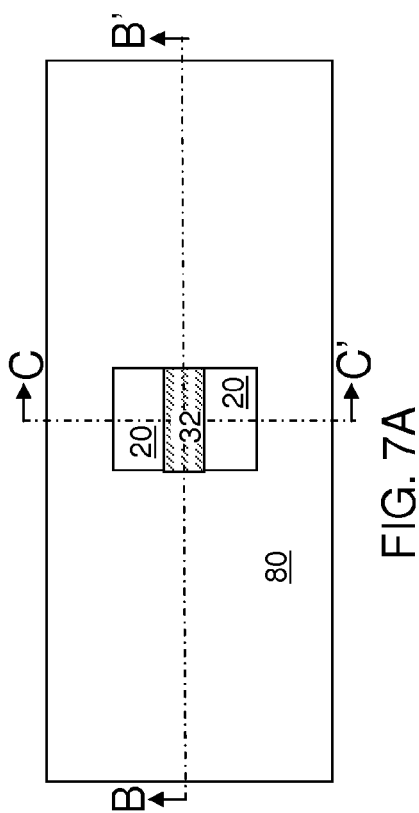
FIG. 7A
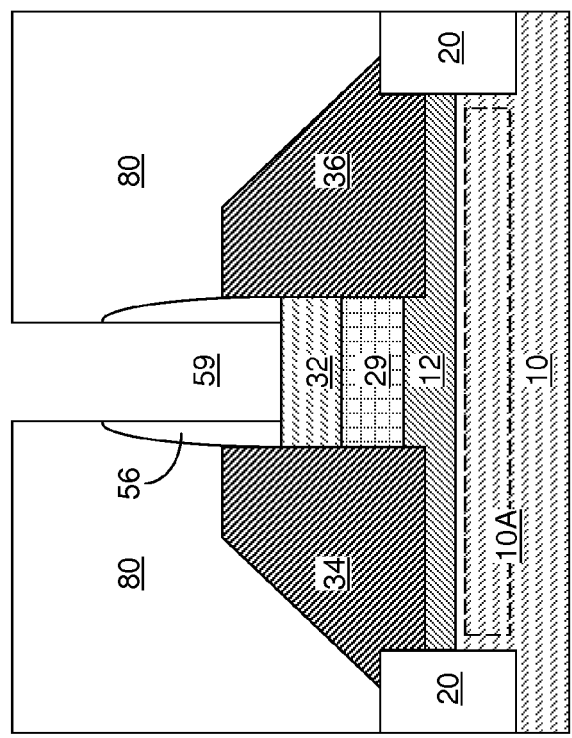
FIG. 7B
FIG. 7C

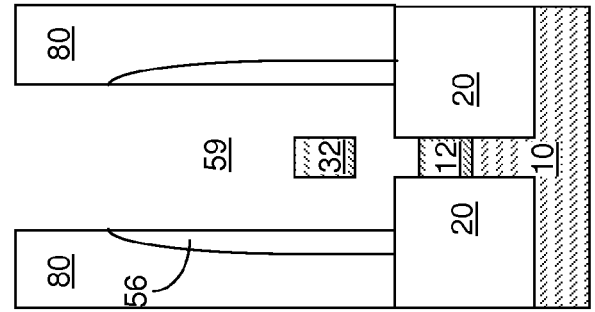
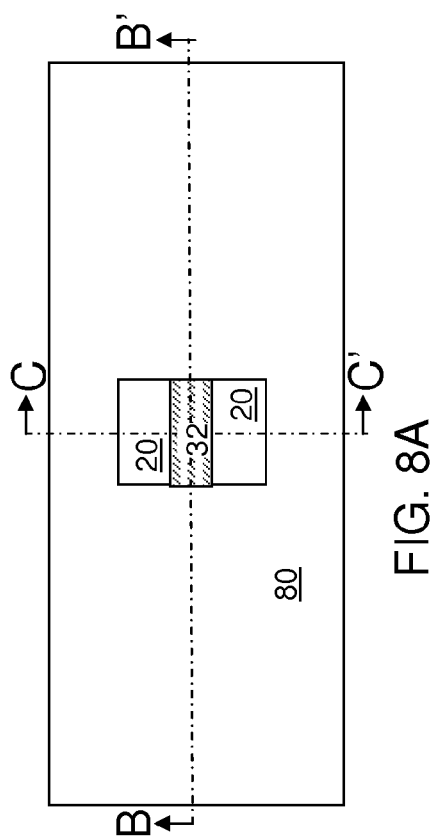
FIG. 8A
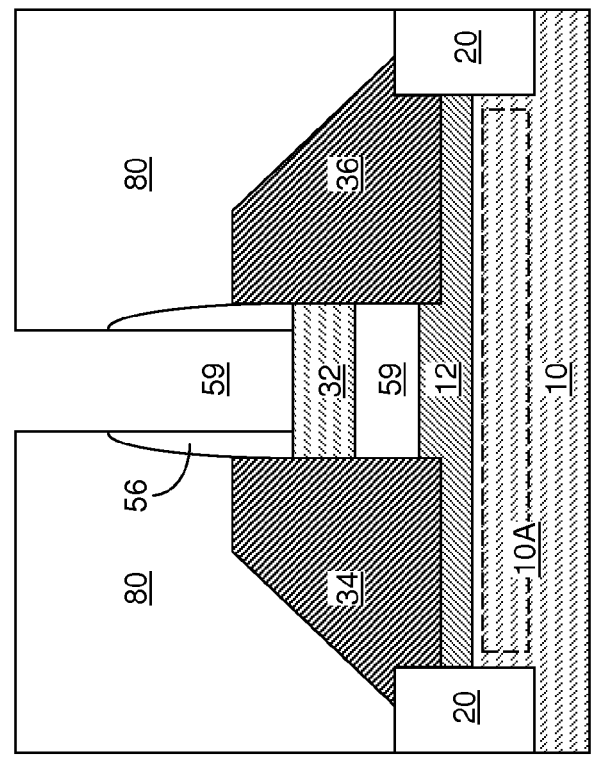
FIG. 8B
FIG. 8C

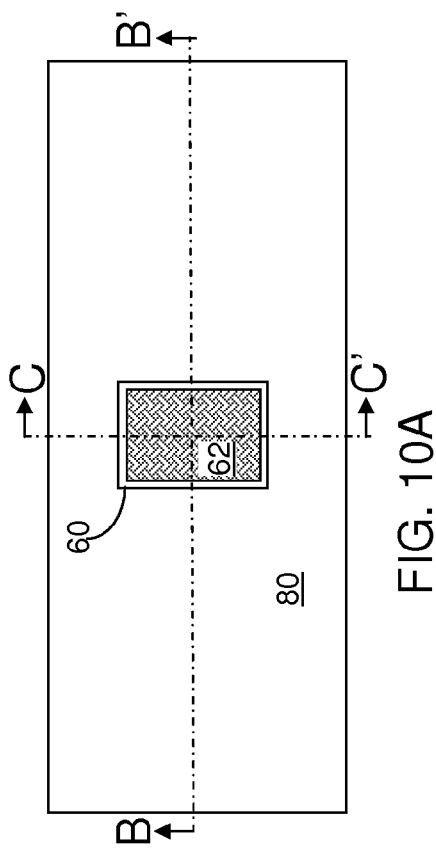
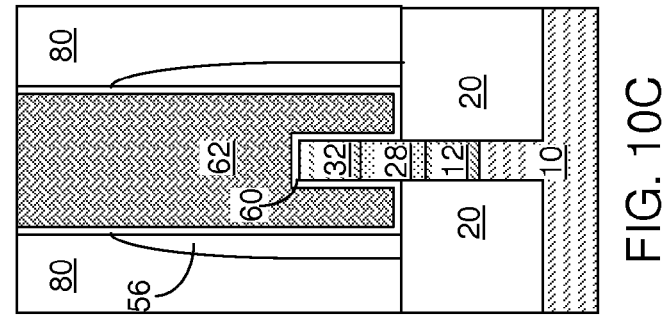

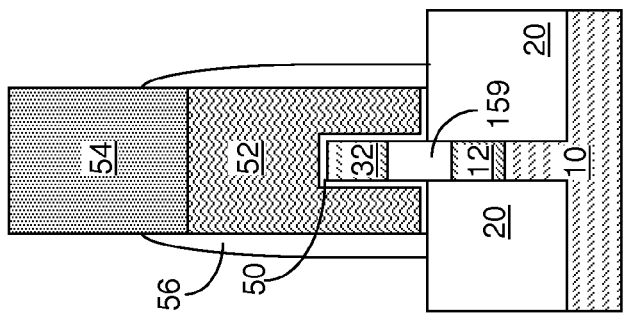
FIG. 12C
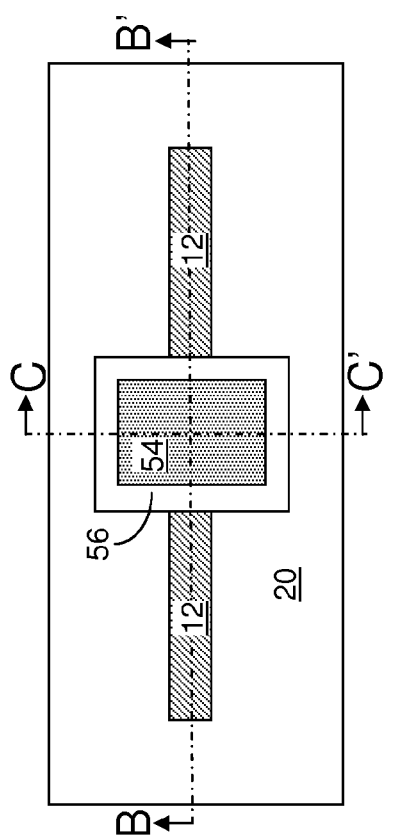
FIG. 12A
FIG. 12B
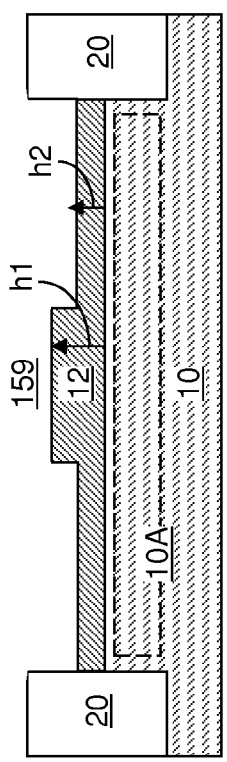

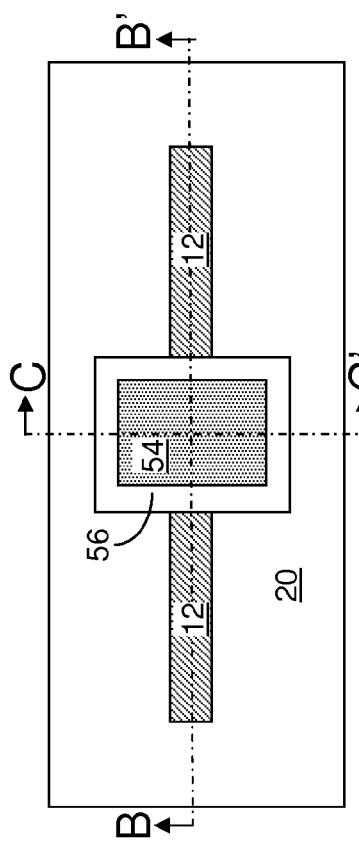
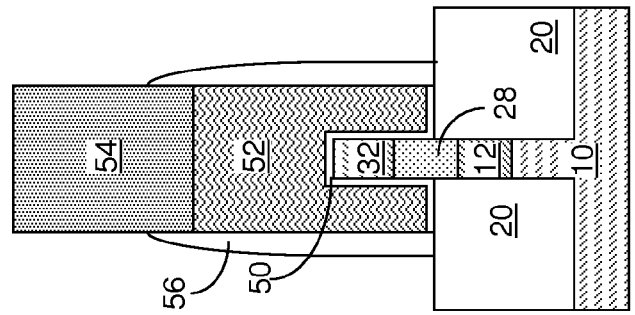
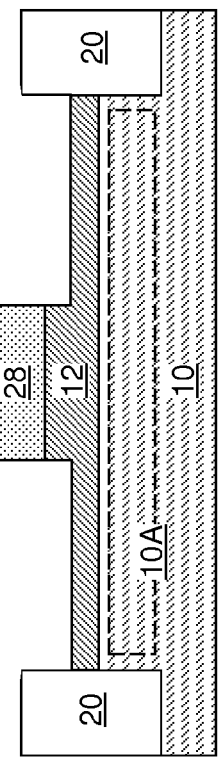
FIG. 13A
FIG. 13B
FIG. 13C

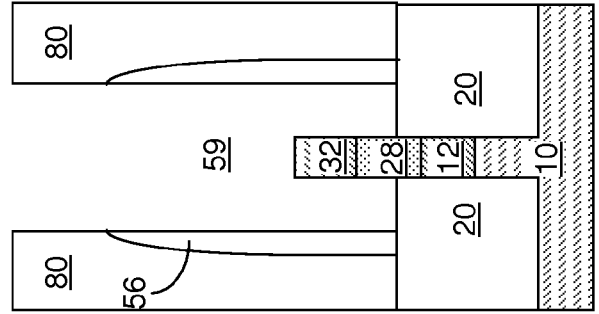
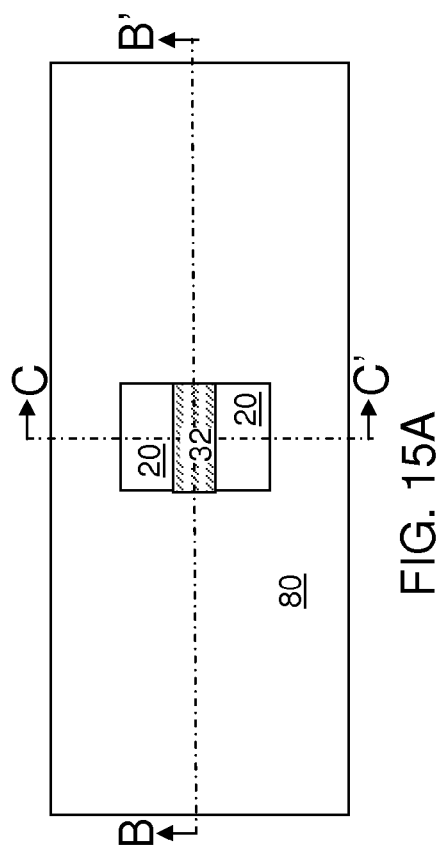
FIG. 15A
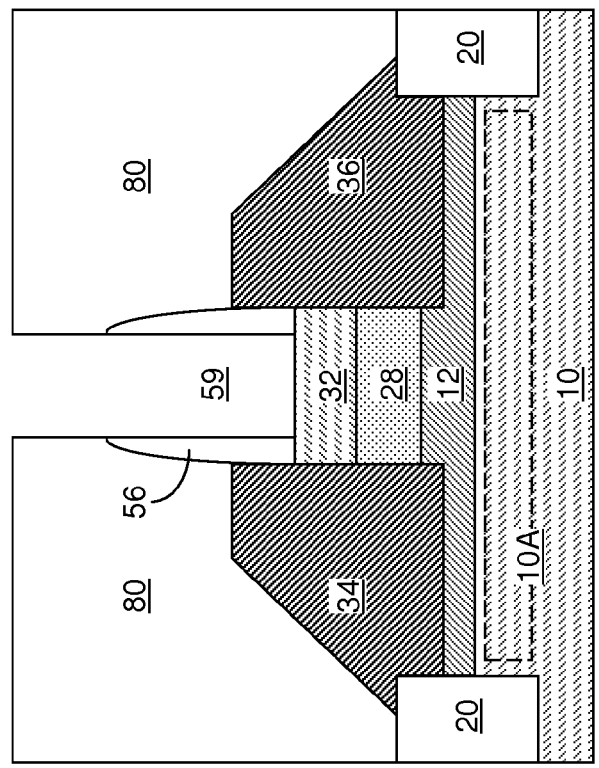
FIG. 15B
FIG. 15C

US 9,190,520 B2

STRAINED FINFET WITH AN ELECTRICALLY ISOLATED CHANNEL

BACKGROUND

The present disclosure relates to a semiconductor structure, and particularly to a fin field effect transistor (finFET) including embedded source and drain stressors and an electrically isolated channel and a method of manufacturing the same.

Various attempts have been made to introduce stress to the channel of a fin field effect transistor (finFET) without much success. For example, wrapping a stressor material on both ends of a rectangular parallelepiped shaped semiconductor fin of a finFET has not been successful in providing a stress to the channel because the stress is applied to the source region or to the drain region within the wrapped semiconductor material along the direction perpendicular to the direction of the channel. While merging of multiple source regions or multiple drain regions of a plurality of parallel semiconductor fins with selective epitaxy is also known, raised source/drain regions formed by epitaxial merging of multiple source/drain regions are structurally non-uniform and not fully single crystalline, providing complications and process variations during further processing due to the non-uniformity and seams between multiple single crystalline portions.

SUMMARY

An optional doped well, a disposable single crystalline semiconductor material layer, and a top semiconductor layer are formed on a substrate, and are patterned to provide a fin structure. A disposable gate structure straddling the fin structure is formed, and end portions of the fin structure are removed to form end cavities. Doped semiconductor material portions are formed on sides of a stack of a disposable single crystalline semiconductor material portion and a channel region including a remaining portion of the top semiconductor layer. After formation of a planarization dielectric layer, the disposable gate structure is removed to form a gate cavity. The disposable single crystalline semiconductor material portion may be replaced with a dielectric material portion after removal of the disposable gate structure or after formation of the stack. The gate cavity is filled with a gate dielectric and a gate electrode. The channel region is stressed by the two doped semiconductor material portions, and is electrically isolated from the substrate by the dielectric material portion.

According to an aspect of the present disclosure, a semiconductor structure includes a vertical stack of a single crystalline semiconductor material portion, a dielectric material portion, and a single crystalline channel portion. A first doped semiconductor material portion is epitaxially aligned to the single crystalline semiconductor material portion and the single crystalline channel portion. A second doped semiconductor material portion is epitaxially aligned to the single crystalline semiconductor material portion and the single crystalline channel portion, and is laterally spaced from the first doped semiconductor material portion by the dielectric material portion and the single crystalline channel portion. A gate stack straddles the dielectric material portion and the single crystalline channel portion. The gate stack includes a gate dielectric and a gate electrode.

According to another aspect of the present disclosure, a method of forming a semiconductor structure is provided. A fin structure including a vertical stack of an upper portion of a semiconductor material layer, a single crystalline semiconductor material portion, a disposable single crystalline semiconductor material portion, and a top semiconductor portion is formed. End portions of the fin structure are replaced with doped semiconductor material portions that are epitaxially aligned to the single crystalline semiconductor material portion and the single crystalline channel portion. A remainder of the disposable single crystalline semiconductor material portion is replaced with a dielectric material portion. A gate structure straddling the single crystalline channel portion and the dielectric material portion is formed. The gate structure includes a gate dielectric and a gate electrode.

BRIEF DESCRIPTION OF SEVERAL VIEWS OF THE DRAWINGS

FIG. 2A is a top-down view of the first exemplary semiconductor structure after patterning of a fin structure and formation of a shallow trench isolation structure according to the first embodiment of the present disclosure.

FIG. 2B is a vertical cross-sectional view of the first exemplary semiconductor structure along the vertical plane B-B' of FIG. 2A.

FIG. 2C is a vertical cross-sectional view of the first exemplary semiconductor structure along the vertical plane C-C' of FIG. 2A.

FIG. 4A is a top-down view of the first exemplary semiconductor structure after recessing portions of the fin structure that are not covered by the disposable gate cap or by the gate spacer according to the first embodiment of the present disclosure.

FIG. 4B is a vertical cross-sectional view of the first exemplary semiconductor structure along the vertical plane B-B' of FIG. 4A.

FIG. 4C is a vertical cross-sectional view of the first exemplary semiconductor structure along the vertical plane C-C' of FIG. 4A.

FIG. 5A is a top-down view of the first exemplary semiconductor structure after formation of a first and second doped semiconductor material portions according to the first embodiment of the present disclosure.

FIG. 5B is a vertical cross-sectional view of the first exemplary semiconductor structure along the vertical plane B-B' of FIG. 5A.

FIG. 5C is a vertical cross-sectional view of the first exemplary semiconductor structure along the vertical plane C-C' of FIG. 5A.

FIG. 6A is a top-down view of the first exemplary semiconductor structure after deposition and planarization of a planarization dielectric layer according to the first embodiment of the present disclosure.

FIG. 6B is a vertical cross-sectional view of the first exemplary semiconductor structure along the vertical plane B-B' of FIG. 6A.

FIG. 6C is a vertical cross-sectional view of the first exemplary semiconductor structure along the vertical plane C-C' of FIG. 6A.

FIG. 7A is a top-down view of the first exemplary semiconductor structure after removal of the disposable gate cap and the disposable gate structure according to the first embodiment of the present disclosure.

FIG. 7B is a vertical cross-sectional view of the first exemplary semiconductor structure along the vertical plane B-B' of FIG. 7A.

FIG. 7C is a vertical cross-sectional view of the first exemplary semiconductor structure along the vertical plane C-C' of FIG. 7A.

FIG. 8A is a top-down view of the first exemplary semiconductor structure after removal of a remainder of a disposable single crystalline semiconductor material portion according to the first embodiment of the present disclosure.

FIG. 8B is a vertical cross-sectional view of the first exemplary semiconductor structure along the vertical plane B-B' of FIG. 8A.

FIG. 8C is a vertical cross-sectional view of the first exemplary semiconductor structure along the vertical plane C-C' of FIG. 8A.

FIG. 10A is a top-down view of the first exemplary semiconductor structure after formation of a gate structure according to the first embodiment of the present disclosure.

FIG. 10B is a vertical cross-sectional view of the first exemplary semiconductor structure along the vertical plane B-B' of FIG. 10A.

FIG. 10C is a vertical cross-sectional view of the first exemplary semiconductor structure along the vertical plane C-C' of FIG. 10A.

FIG. 12A is a top-down view of a second exemplary semiconductor structure after removal of a remainder of a disposable single crystalline semiconductor material portion according to an embodiment of the present disclosure.

FIG. 12B is a vertical cross-sectional view of the second exemplary semiconductor structure along the vertical plane B-B' of FIG. 12A.

FIG. 12C is a vertical cross-sectional view of the second exemplary semiconductor structure along the vertical plane C-C' of FIG. 12A.

FIG. 13A is a top-down view of the second exemplary semiconductor structure after formation of a dielectric material portion according to the second embodiment of the present disclosure.

FIG. 13B is a vertical cross-sectional view of the second exemplary semiconductor structure along the vertical plane B-B' of FIG. 13A.

FIG. 13C is a vertical cross-sectional view of the second exemplary semiconductor structure along the vertical plane C-C' of FIG. 13A.

FIG. 15A is a top-down view of the second exemplary semiconductor structure after removal of the disposable gate cap and the disposable gate structure according to the second embodiment of the present disclosure.

FIG. 15B is a vertical cross-sectional view of the second exemplary semiconductor structure along the vertical plane B-B' of FIG. 15A.

FIG. 15C is a vertical cross-sectional view of the second exemplary semiconductor structure along the vertical plane C-C' of FIG. 15A.

DETAILED DESCRIPTION

Figure 1A:
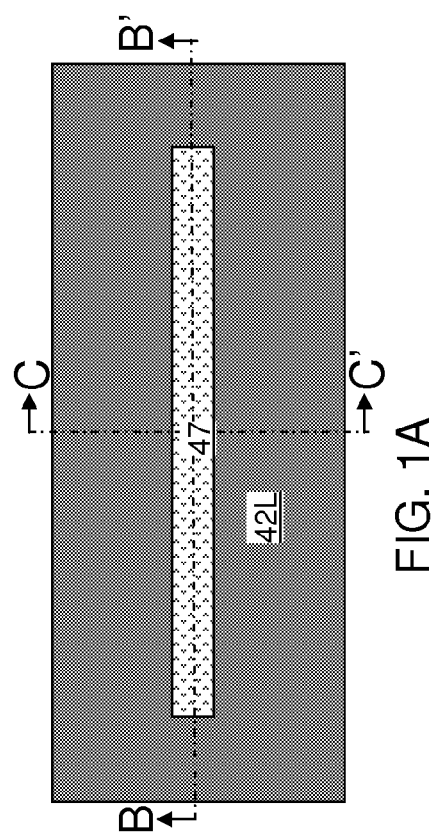
FIG. 1A is a top-down view of a first exemplary semiconductor structure after formation of a stack of a semiconductor substrate layer, a single crystalline semiconductor material layer, a disposable single crystalline semiconductor material layer, and a top semiconductor layer and formation of a patterned photoresist layer according to a first embodiment of the present disclosure.

As stated above, the present disclosure relates to a fin field effect transistor (finFET) including embedded source and drain stressors and an electrically isolated channel and a method of manufacturing the same. Aspects of the present disclosure are now described in detail with accompanying figures. It is noted that like reference numerals refer to like elements across different embodiments. The drawings are not necessarily drawn to scale.

Figure 1C:
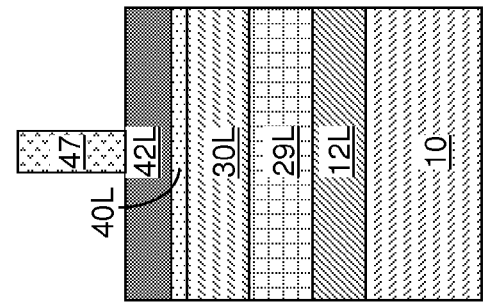
FIG. 1C is a vertical cross-sectional view of the first exemplary semiconductor structure along the vertical plane C-C' of FIG. 1A.
Figure 1B:
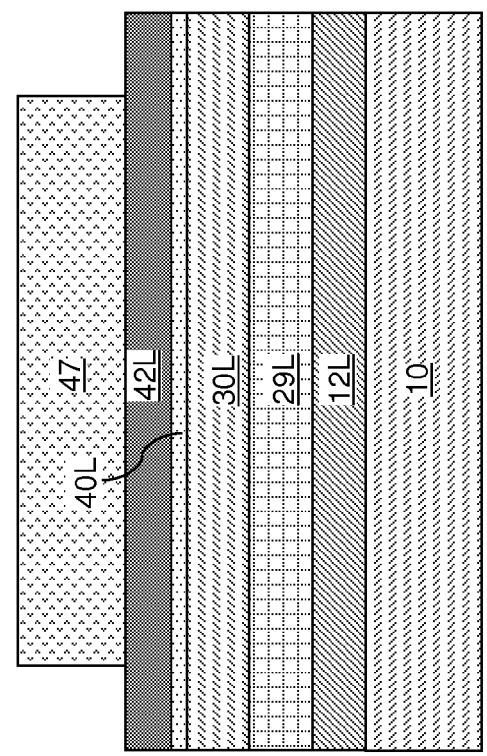
FIG. 1B is a vertical cross-sectional view of the first exemplary semiconductor structure along the vertical plane B-B' of FIG. 1A.

Referring to FIGS. 1A-1C, a first exemplary semiconductor structure according to a first embodiment of the present disclosure includes a vertical stack of a semiconductor substrate layer 10, an optional single crystalline semiconductor material layer 12L, a disposable single crystalline semiconductor material layer 29L, and a top semiconductor layer 30L. The semiconductor substrate layer 10 includes a single crystalline semiconductor material such as single crystalline silicon, a single crystalline silicon-germanium alloy, a single crystalline compound semiconductor material, or combinations or stacks thereof. Optionally, at least one additional substrate layer (not shown) may be present underneath the semiconductor substrate layer 10. The at least one additional substrate layer may include, for example, an insulator layer or a combination of a buried insulator layer and a handle substrate as in the case of a semiconductor-on-insulator (SOI) substrate.

The optional single crystalline semiconductor material layer 12L, if present, includes a single crystalline semiconductor material that is in epitaxial alignment with the single crystalline structure of the semiconductor substrate layer 10. In one embodiment, the optional single crystalline semiconductor material layer 12L can include a silicon-germanium alloy or a silicon-carbon alloy. The thickness of the optional single crystalline semiconductor material layer 12L can be from 10 nm to 10,000 nm, although lesser and greater thicknesses can also be employed. The optional single crystalline semiconductor material layer 12L may include an intrinsic single crystalline semiconductor material, or a doped single crystalline semiconductor material having a doping of a first conductivity type. The first conductivity type can be p-type or n-type.

The semiconductor material of the optional single crystalline semiconductor material layer 12L is herein referred to as a first semiconductor material. The first semiconductor material can be an elemental semiconductor material or a compound semiconductor material. For example, the first semiconductor material can be silicon, germanium, a silicon-germanium alloy, or a silicon-carbon alloy. The first semiconductor material may, or may not, be doped with p-type dopants and/or n-type dopants, i.e., may be doped or may be intrinsic. If the first semiconductor material is doped, the type of doping of the first semiconductor material is herein referred to as a first conductivity type.

The disposable single crystalline semiconductor material layer 29L includes a single crystalline semiconductor material that is different from the semiconductor material of the optional single crystalline semiconductor material layer 12L, if present, or from the semiconductor material of the semiconductor substrate layer 10 if the optional single crystalline semiconductor material layer 12L is not present. The disposable single crystalline semiconductor material layer 29L can be in epitaxial alignment with the optional single crystalline semiconductor material layer 12L. If the optional single crystalline semiconductor material layer 12L is not present, the disposable single crystalline semiconductor material layer 29L can be in epitaxial alignment with the semiconductor material layer 10. The thickness of the disposable single crystalline semiconductor material layer 29L can be from 10 nm to 300 nm, although lesser and greater thicknesses can also be employed.

In one embodiment, the disposable single crystalline semiconductor material layer 29L includes n-doped single crystalline silicon, an n-doped single crystalline silicon-germanium alloy, or an n-doped single crystalline silicon-carbon ally. The disposable single crystalline semiconductor material layer 29L can be formed by deposition of an in-situ n-doped single crystalline semiconductor material by epitaxy, or can be formed by deposition of an intrinsic single crystalline semiconductor material and implantation of n-type dopants such as P, As, and/or Sb. The concentration of the n-type dopants in the disposable single crystalline semiconductor material layer 29L can be from $1.0 \times 10^{19}/cm^3$ to $2.0 \times 10^{21}/cm^3$, although lesser and greater concentrations can also be employed.

In another embodiment, the disposable single crystalline semiconductor material layer 29L includes porous single crystalline silicon, a porous single crystalline silicon-germanium alloy, or a porous single crystalline silicon-carbon alloy. Porous single crystalline silicon, a porous single crystalline silicon-germanium alloy, or a porous single crystalline silicon-carbon alloy has nanoporous holes in the microstructure, rendering a large surface to volume ratio in the order of 500 $m^2/cm^3$. Porous single crystalline silicon, a porous single crystalline silicon-germanium alloy, or a porous single crystalline silicon-carbon alloy can be formed by first depositing single crystalline silicon, a single crystalline silicon-germanium alloy, or a single crystalline silicon-carbon alloy, and by subsequently anodizing or etching (for example, with hydrofluoric acid or nitric acid) the single crystalline silicon, the single crystalline silicon-germanium alloy, or the single crystalline silicon-carbon alloy. Methods of anodizing or etching single crystalline silicon, a single crystalline silicon-germanium alloy, or a single crystalline silicon-carbon alloy to form pores therein are known in the art.

In yet another embodiment, the disposable single crystalline semiconductor material layer 29L includes a single crystalline silicon-germanium alloy having a germanium concentration greater than 20% in atomic percentage. The atomic concentration of germanium in the disposable single crystalline semiconductor material layer 29L may be in a range from 20% to 99.9%. In one embodiment, the atomic concentration of germanium in the disposable single crystalline semiconductor material layer 29L may be in a range from 30% to 80%. In another embodiment, the atomic concentration of germanium in the disposable single crystalline semiconductor material layer 29L may be in a range from 40% to 60%.

The top semiconductor layer 30L is single crystalline, and can be in epitaxial alignment with the single crystalline structure of the disposable single crystalline semiconductor material layer 29L. The top semiconductor layer 30L can be intrinsic or can be doped with electrical dopants (p-type dopants or n-type dopants). If the optional single crystalline semiconductor material layer 12L and the top semiconductor layer 30L are doped, the optional single crystalline semiconductor material layer 12L and the top semiconductor layer 30L have the same type of doping. In other words, the top semiconductor layer 30L can have a doping of the first conductivity type. In one embodiment, the first semiconductor material can be single crystalline silicon. The thickness of the top semiconductor layer 30L can be from 10 nm to 500 nm, although lesser and greater thicknesses can also be employed.

An optional dielectric pad layer 40L can be formed on the top surface of the top semiconductor layer 30L. The optional dielectric pad layer 40L includes a dielectric material, which can be, for example, silicon oxide, silicon oxynitride, a dielectric metal oxide, or a combination thereof. The optional dielectric pad layer 40L can be formed, for example, by chemical vapor deposition (CVD) or conversion of a topmost portion of the top semiconductor layer 30L by thermal oxidation, thermal nitridation, plasma oxidation, plasma nitridation, or a combination thereof. The thickness of the optional dielectric pad layer 40L can be from 1 nm to 20 nm, although lesser and greater thicknesses can also be employed.

A fin cap dielectric layer 42L can be formed over the top semiconductor layer 30L. The fin cap dielectric layer 42L can be formed directly on the optional dielectric pad layer 40L, if present. The fin cap dielectric layer 42L may include a dielectric material such as silicon nitride, silicon oxynitride, or a nitrogen-doped organosilicate glass. The fin cap dielectric layer 42L can be deposited, for example, by chemical vapor deposition (CVD). The thickness of the fin cap dielectric layer 42L can be from 5 nm to 50 nm, although lesser and greater thicknesses can also be employed.

A photoresist layer 47 is applied over the top surface of the fin cap dielectric layer 42L, and is lithographically patterned in the shape of at least one fin structure to be subsequently formed. For example, the shape of a portion of the photoresist layer 47 after lithographic patterning may be rectangular.

Referring to FIGS. 2A-2C, the pattern in the photoresist layer 47 is transferred through the stack of the fin cap dielectric layer 42L, the optional dielectric pad layer 40L, the top semiconductor layer 30L, the disposable single crystalline semiconductor material layer 29L, and the optional single crystalline semiconductor material layer 12L, and through an upper portion 10A of the semiconductor substrate layer 10. The pattern transfer can be effected, for example, by at least one anisotropic etch that employs the photoresist layer 47 as an etch mask. A fin structure including a vertical stack of an upper portion of the semiconductor substrate layer 10, an optional single crystalline semiconductor material portion 12, a disposable single crystalline semiconductor material portion 29, a top semiconductor portion 30, an optional dielectric pad portion 40, and a fin cap dielectric portion 42 is formed.

The optional single crystalline semiconductor material portion 12 is a remaining portion of the optional single crystalline semiconductor material layer 12L after the pattern transfer, the disposable single crystalline semiconductor material portion 29 is a remaining portion of the disposable single crystalline semiconductor material layer 29L after the pattern transfer, the top semiconductor portion 30 is a remaining portion of the top semiconductor layer 30L after the pattern transfer, the optional dielectric pad portion 40 is a remaining portion of the optional dielectric pad layer 40L, and the fin cap dielectric portion 42 is a remaining portion of the fin cap dielectric layer 42L. The entirety of the fin structure (10A, 12, 29, 30, 40, 42) can have the same horizontal cross-sectional area throughout, and all sidewalls of the fin structure (10A, 12, 29, 30, 40, 42) can be substantially vertical. The photoresist layer 47 is subsequently removed, for example, by ashing. The sidewalls of the various portions of the fin structure (10A, 12, 29, 30, 40, 42) are vertically coincident with one another. As used herein, a first surface is "vertically coincident" with a second surface if the first surface and the second surface are located within a same vertical plane.

A dielectric material can be subsequently deposited and planarized employing the fin cap dielectric portion 42 as a stopping material layer. The dielectric material can be, for example, silicon oxide. The dielectric material is subsequently recessed relative to the top surface of the fin cap dielectric portion 42 employing an etch, which can be a wet etch or a dry etch. The duration of the etch can be selected such that the recessed top surface of the dielectric material is between the top surface of the disposable single crystalline semiconductor material portion 29 and the bottom surface of the disposable single crystalline semiconductor material portion 29. The remaining portion of the dielectric material constitutes a shallow trench isolation (STI) structure 20, which laterally surrounds a lower portion of the fin structure (10A, 12, 29, 30, 40, 42).

The fin cap dielectric portion 42 and the optional dielectric pad 40 can be removed, for example, by a wet etch. In one embodiment, the removal of the fin cap dielectric portion 42 can be performed selective to the STI structure 20, i.e., without removing the STI structure 20.

Figure 3C:
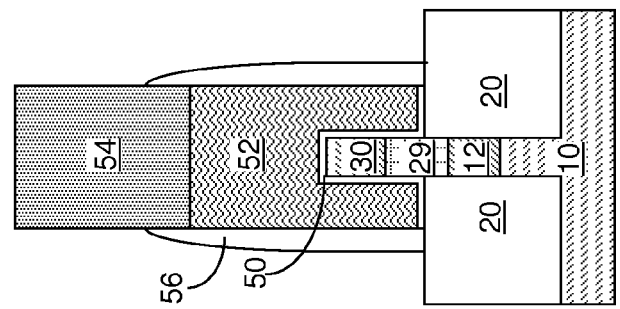
FIG. 3C is a vertical cross-sectional view of the first exemplary semiconductor structure along the vertical plane C-C' of FIG. 3A.
Figure 3A:
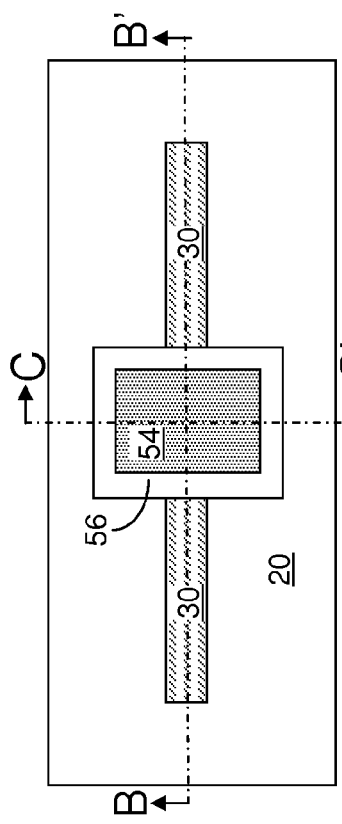
FIG. 3A is a top-down view of the first exemplary semiconductor structure after formation of a disposable gate structure, a disposable gate cap, and a gate spacer according to the first embodiment of the present disclosure.
Figure 3B:
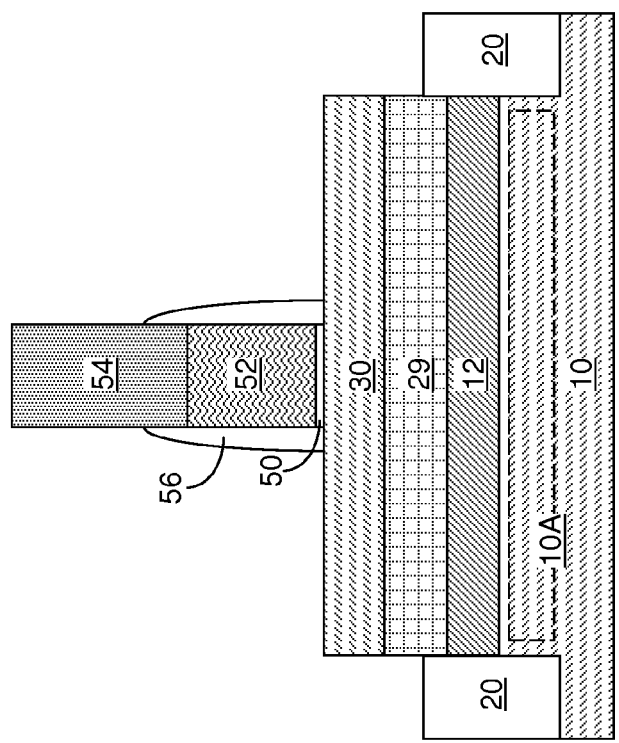
FIG. 3B is a vertical cross-sectional view of the first exemplary semiconductor structure along the vertical plane B-B' of FIG. 3A.

Referring to FIGS. 3A-3C, a disposable gate structure (50, 52) and a disposable gate cap 54 are formed over the fin structure (10A, 12, 29, 30). For example, a disposable gate dielectric layer, a disposable gate material layer, and a disposable gate cap layer can be sequentially deposited. The disposable gate dielectric layer can include a dielectric material such as silicon oxide. The thickness of the disposable gate dielectric layer can be from 3 nm to 30 nm, although lesser and greater thicknesses can also be employed. The disposable gate material layer can include a disposable material such as germanium, a silicon-germanium alloy, an organic material, amorphous carbon, diamond-like carbon, or any other disposable material that can be removed selective to the dielectric material of the gate dielectric layer. The thickness of the disposable gate material layer can be from 30 nm to 1,000 nm, although lesser and greater thicknesses can also be employed. The disposable gate cap layer includes a dielectric material that is different from the dielectric material of the STI structure 20. For example, the disposable gate cap layer can include silicon oxide or a dielectric metal oxide. The thickness of the disposable gate cap layer can be from 30 nm to 300 nm, although lesser and greater thicknesses can also be employed. A photoresist layer (not shown) is applied over the vertical stack of the disposable gate cap layer, the disposable gate material layer, and the disposable gate dielectric layer, and is lithographically patterned to form a shape that straddles the fin structure (10A, 12, 29, 30). The pattern in the photoresist layer is transferred through the vertical stack. A remaining portion of the disposable gate cap layer is the disposable gate cap portion 54. A remaining portion of the disposable gate material layer is the disposable gate material portion 52. A remaining portion of the disposable gate dielectric layer is the disposable gate dielectric portion 50. The disposable gate dielectric portion 50 and the disposable gate material portion 52 collectively constitute a disposable gate structure (50, 52). The disposable gate structure (50, 52) and the disposable gate cap portion 54 can have vertical sidewalls. The various sidewalls of the disposable gate structure (50, 52) and the disposable gate cap portion 54 are vertically coincident among one another. The disposable gate structure (50, 52) straddles the fin structure (10A, 12, 29, 30).

A gate spacer 56 can be formed around the stack of the disposable gate structure (50, 52) and the disposable gate cap portion 54. In one embodiment, the gate spacer 56 includes a dielectric material that is different from the dielectric material of the disposable gate cap portion 54. The dielectric material of the gate spacer 56 can be, for example, silicon oxide, silicon oxynitride, silicon nitride, or a dielectric metal oxide. The gate spacer 56 can be formed, for example, by deposition of a conformal dielectric material layer, and by removal of horizontal portions of the conformal dielectric material layer by an anisotropic etch. The thickness of the gate spacer 56, as measured at a bottom portion of the gate spacer 56 that contacts the top surface of the top semiconductor portion 30, can be from 10 nm to 100 nm, although lesser and greater thicknesses can also be employed.

Referring to FIGS. 4A-4C, portions of the fin structure (10A, 12, 29, 30) that are not covered by the disposable gate structure (50, 52) or by the gate spacer 56 are recessed by an anisotropic etch. The anisotropic etch can employ the disposable gate cap 54 and the gate spacer 56 as an etch mask. End portions of the fin structure (10A, 12, 29, 30) are anisotropically etched. The etch chemistry of the anisotropic etch can be selected so that the STI structure 20 is not etched during the anisotropic etch. Horizontal surfaces of the single crystalline semiconductor material portion 12 are physically exposed by anisotropic etch of the end portions of the fin structure (10A, 12, 29, 30).

The remaining portion of the top semiconductor portion 30 after the anisotropic etch is herein referred to as a single crystalline channel portion 32. The single crystalline channel portion 32 may be undoped, or have a doping of the first conductivity type. The remainder of the disposable single crystalline semiconductor material portion 29 has the same horizontal cross-sectional area as the single crystalline channel portion 32. An upper portion of the optional single crystalline semiconductor material portion 12 has the same horizontal cross-sectional area as the single crystalline channel portion 32.

If the optional single crystalline semiconductor material portion 12 is not present, the anisotropic etch exposes horizontal surface of the upper portion 10A of the semiconductor substrate layer 10.

Referring to FIGS. 5A-5C, a doped semiconductor material is selectively deposited on semiconductor surfaces employing a selective epitaxy process. The doped semiconductor material is herein referred to as a second semiconductor material. If the single crystalline channel portion 32 has a doping of the first conductivity type, the second semiconductor material has a doping of a second conductivity type, which is the opposite conductivity type of the first conductivity type.

In the selective epitaxy process, a reactant gas that deposits a semiconductor material and an etchant gas that etches the semiconductor material are simultaneously or alternately flowed into a processing chamber in which the first exemplary semiconductor structure is loaded. The second semiconductor material is deposited only on semiconductor surfaces, and is not deposited on dielectric surfaces. The deposited second semiconductor material replaces the end portions of the fin structure (10A, 12, 29, 30) of FIGS. 3A-3C that are removed during the anisotropic etch in the processing steps of FIGS. 4A-4C. The deposited second semiconductor material forms a first doped semiconductor material portion 34 at one end of the fin structure (10A, 12, 29, 32) and a second doped semiconductor material portion 36 at another end of the fin structure (10A, 12, 29, 32).

The second semiconductor material is in epitaxial alignment with underlying semiconductor materials. Specifically, the second semiconductor material in each of the first and second doped semiconductor material portions (34, 36) can be in epitaxial alignment with the semiconductor materials of the optional single crystalline semiconductor material portion 12, the disposable single crystalline semiconductor material portion 29, and the single crystalline channel portion 32.

The second semiconductor material can be different from the first semiconductor material of the optional single crystalline semiconductor material portion 12. If the optional single crystalline semiconductor material portion 12 is not present, the second semiconductor material can be different from the semiconductor material of the upper portion 10A of the semiconductor substrate layer 10.

For example, if the first semiconductor material of the optional single crystalline semiconductor material portion 12 (or the semiconductor material of the upper portion 10A of the semiconductor substrate layer 10) is single crystalline silicon, the second semiconductor material can be a single crystalline silicon-germanium alloy or a single crystalline silicon-carbon alloy. If the first semiconductor material is a single crystalline alloy of at least two elemental semiconductor materials, the second semiconductor material can be a single crystalline material including one or more elemental semiconductor materials having a different lattice constant. If the first semiconductor material is a single crystalline compound semiconductor material, the second semiconductor material can be another single crystalline compound semiconductor material having a different lattice constant.

If the second semiconductor material has a different lattice constant than the first semiconductor material of the optional single crystalline semiconductor material portion 12 (or the semiconductor material of the upper portion 10A of the semiconductor substrate layer 10), the lattice mismatch between the second semiconductor material and the first semiconductor material and the epitaxial registry therebetween causes the second semiconductor material to be under a compressive stress or a tensile stress along horizontal directions. In this case, the first and second doped semiconductor material portions (34, 36) generate the same type of stress within the single crystalline channel portion 32 by partially relieving the stress within the first and second doped semiconductor material portions (34, 36). As such, the first and second doped semiconductor material portions (34, 36) are stress-generating doped semiconductor material portions that are epitaxially aligned to the single crystalline semiconductor material portion 12 and the single crystalline channel portion 32.

The first doped semiconductor material portion 34, which can be a first stress-generating semiconductor material portion, is formed in epitaxial alignment with the optional single crystalline semiconductor material portion 12 and the single crystalline channel portion 32 directly on the remainder of the disposable single crystalline semiconductor material portion 29. The second doped semiconductor material portion 36, which can be a stress-generating semiconductor material portion, is formed in epitaxial alignment with the optional single crystalline semiconductor material portion 12 and the single crystalline channel portion 32 directly on the remainder of the disposable single crystalline semiconductor material portion 29.

In one embodiment, the fin structure (10A, 12, 29 32) has a same width throughout, i.e., the same dimension between two sidewalls extending along the lengthwise direction of the fin structure (10A, 12, 29, 32). As used herein, a "lengthwise direction" is a direction along which two parallel sidewalls having a greatest lateral extent extends within a structure. The STI structure 20 laterally surrounds the optional single crystalline semiconductor material portion 12 and the upper portion 10A of the semiconductor substrate layer 10.

Physically exposed surfaces of the first and second doped semiconductor material portions (34, 36) can have crystallographic facets. Surfaces of the first and second doped semiconductor material portions (34, 36) can physically contact portions of the top surface of the STI structure 20. Upper sub-portions of the first and second doped semiconductor material portions (34, 36) can have a width greater than the width of the fin structure (10A, 12, 29 32).

Referring to FIGS. 6A-6C, a planarization dielectric layer 80 is formed above the fin structure (10A, 12, 29, 32) and the first and second doped semiconductor material portions (34, 36). The planarization dielectric layer 80 includes a dielectric material such as silicon oxide, silicon nitride, silicon oxynitride, or organosilicate glass (OSG). The planarization dielectric layer 80 can include a self-planarizing material such as a spin-on glass (SOG). Alternatively, the planarization dielectric layer 80 can be deposited above the top surface of the disposable gate cap portion 54, and subsequently planarized by chemical mechanical planarization (CMP) employing the disposable gate cap portion 54 as a stopping structure.

Referring to FIGS. 7A-7C, the disposable gate cap portion 54 is removed selective to the planarization dielectric layer 80 by an etch. The etch can be a wet etch or a dry etch. For example, if the planarization dielectric layer 80 includes silicon oxide and if the disposable gate cap portion 54 includes silicon nitride, the etch can be a wet etch employing hot phosphoric acid.

The disposable gate structure (50, 52) is subsequently removed by another etch. The chemistry of this etch is selected such that the removal of the disposable gate structure (50, 52) does not collaterally etch the single crystalline channel portion 32. In one embodiment, the disposable gate material portion 52 can be removed selective to (without etching) the disposable gate dielectric portion 50, and the disposable gate dielectric portion 50 can be subsequently removed selective to the single crystalline channel portion 32. A gate cavity 59 is formed in the volume from which the disposable gate cap portion 54 and the disposable gate structure (50, 52) are removed.

Referring to FIGS. 8A-8C, the disposable single crystalline semiconductor material portion 29 is removed by a wet etch or a dry etch selective to the single crystalline channel portion 32 and selective to the optional single crystalline semiconductor material portion 12. If the optional single crystalline semiconductor material portion 12 is not present, the disposable single crystalline semiconductor material portion 29 is removed selective to the single crystalline channel portion 32 and selective to the upper portion 10A of the semiconductor substrate layer 10. The gate cavity 59 is extended underneath the single crystalline channel portion 32, and the topmost surface of the optional single crystalline semiconductor material portion 12 and the bottom surface of the single crystalline channel portion 32 are physically exposed. The gate cavity 59 surrounds the single crystalline channel portion 32.

In one embodiment, the disposable single crystalline semiconductor material portion 29 can include an n-doped single crystalline silicon or an n-doped single crystalline silicon-containing alloy. In this case, the removal of the disposable single crystalline semiconductor material portion 29 selective to semiconductor materials of the single crystalline semiconductor material portion 12 and the single crystalline channel portion 32 can be performed by an chlorine-based anisotropic etch described in U.S. Pat. No. 8,138,053.

In another embodiment, the disposable single crystalline semiconductor material portion 29 can include porous single crystalline silicon, a porous single crystalline silicon-germanium alloy, or a porous single crystalline silicon-carbon alloy. In this case, the removal of the disposable single crystalline semiconductor material portion 29 selective to semiconductor materials of the single crystalline semiconductor material portion 12 and the single crystalline channel portion 32 can be performed by an etch chemistry that etches porous silicon selective to non-porous semiconductor materials. Etch chemistries that provide an etch rate for a porous semiconductor material that is at least an order of magnitude greater than an etch rate for non-porous semiconductor materials are known in the art.

In yet another embodiment, the disposable single crystalline semiconductor material portion 29 can include a silicon-germanium alloy having a germanium concentration greater than 20%, and the removal of the disposable single crystalline semiconductor material portion 29 selective to semiconductor materials of the single crystalline semiconductor material portion 12 and the single crystalline channel portion 32 can be performed by an etch chemistry that etches a silicon-germanium alloy having a germanium concentration greater than 20% selective to a semiconductor material having a lesser concentration of germanium. For example, the silicon-germanium alloy having a germanium concentration greater than 20% can be removed selective to a semiconductor material having a lesser concentration of germanium employing hydrogen peroxide and hydrofluoric acid.

Figure 9C:
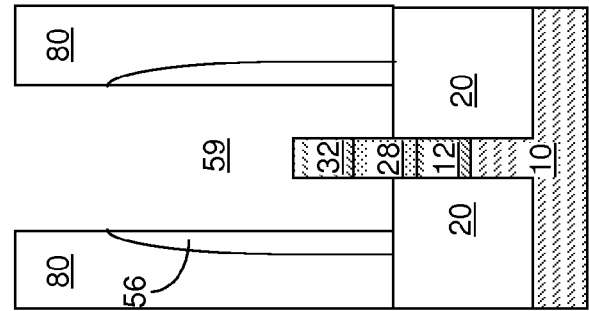
FIG. 9C is a vertical cross-sectional view of the first exemplary semiconductor structure along the vertical plane C-C' of FIG. 9A.
Figure 9A:
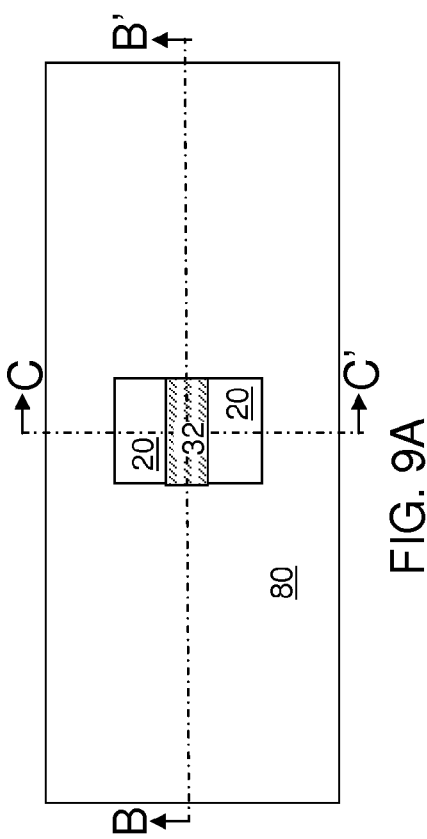
FIG. 9A is a top-down view of the first exemplary semiconductor structure after formation of a dielectric material portion according to the first embodiment of the present disclosure.
Figure 9B:
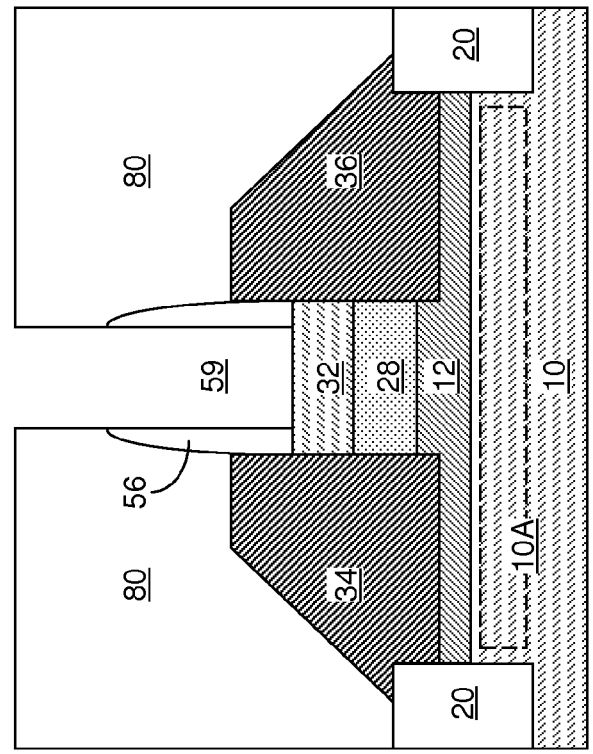
FIG. 9B is a vertical cross-sectional view of the first exemplary semiconductor structure along the vertical plane B-B' of FIG. 9A.

Referring to FIGS. 9A-9C, the portion of the gate cavity 59, from which the disposable single crystalline semiconductor material portion 29 is removed, is filled with a dielectric material portion 28. The dielectric material portion 28 includes a dielectric material such as silicon oxide, silicon nitride, silicon oxynitride, organosilicate glass (OSG), a dielectric metal oxide, or a combination thereof. The dielectric material portion 28 can be formed, for example, by filling at least a bottom portion of the gate cavity 59, i.e., the space below the plane of the bottom surface of the single crystalline channel portion 32, with a dielectric material, and by removing portions of the deposited dielectric material that do not underlie the single crystalline channel portion 32. In one embodiment, filling the bottom portion of the gate cavity 59 can be effected by a conformal deposition of a dielectric material or by spin-coating. The removal of portions of the deposited dielectric material can be effected by recessing the deposited dielectric material employing an anisotropic etch process in which the single crystalline channel portion 32 is employed as an etch mask. Thus, the dielectric material portion 28 is formed above the single crystalline semiconductor material portion 12 and below the single crystalline channel portion 32. The dielectric material portion 28 vertically contacts the single crystalline semiconductor material portion 12 and the single crystalline channel portion 32. The sidewalls of the dielectric material portion 12 can be vertically coincident with the sidewalls of the single crystalline channel portion 32 and the sidewalls of the single crystalline semiconductor material portion 12.

Referring to FIGS. 10A-10C, a gate structure (60, 62) is formed in the gate cavity 59. The gate structure (60, 62) includes a gate dielectric 60 and a gate electrode 62. The gate dielectric 60 can include a conventional dielectric material such as silicon oxide, silicon nitride, and silicon oxynitride, and/or a high dielectric constant (high-k) dielectric material having a dielectric constant greater than 8.0. High-k dielectric materials include dielectric metal oxides, dielectric metal nitride, and dielectric metal oxynitrides. The gate structure (60, 62) replaces the volume previously occupied by the disposable gate cap structure 54 and the disposable gate structure (50, 52), and as such, is a replacement gate structure.

The first exemplary semiconductor structure can include a vertical stack of a single crystalline semiconductor material portion 12, a dielectric material portion 28, and a single crystalline channel portion 32. The first exemplary semiconductor structure can further include a first doped semiconductor material portion 34 epitaxially aligned to the single crystalline semiconductor material portion 12 and the single crystalline channel portion 32, and a second doped semiconductor material portion 36 epitaxially aligned to the single crystalline semiconductor material portion 12 and the single crystalline channel portion 32. The second doped semiconductor material portion 36 is laterally spaced from the first doped semiconductor material portion 34 by the dielectric material portion 28 and the single crystalline channel portion 32. Each of the first and second doped semiconductor material portions (34, 36) can be a stress-generating doped semiconductor material portions that apply a longitudinal stress along the lengthwise direction of the single crystalline channel portion 32. The longitudinal stress can be tensile or compressive, and is along the lengthwise direction of the fin structure (10A, 12, 28, 32). A gate stack (60, 62) including a gate dielectric 60 and a gate electrode 62 is also provided. The gate stack (60, 62) straddles the dielectric material portion 28 and the single crystalline channel portion 32.

The vertical stack can further include a semiconductor material layer 10, and an upper portion 10A of the semiconductor substrate layer 10 can have the same width throughout and can contact the shallow trench isolation structure 20. The single crystalline semiconductor material portion 12 includes a center portion having a first height h1, and two end portions having a second height h2 that is less than the first height h1.

First sidewalls of the single crystalline semiconductor material portion 12, the dielectric material portion 28, and the single crystalline channel portion 32 are in contact with the first doped semiconductor material portion 32, and are vertically coincident among one another. Second sidewalls of the single crystalline semiconductor material portion 12, the dielectric material portion 28, and the single crystalline channel portion 32 are in contact with the second doped semiconductor material portion 36, and are vertically coincident among one another. A gate spacer 56 laterally surrounds the gate stack (60, 62). The first sidewalls and the second sidewalls are vertically coincident with bottom portions of outer sidewalls of the gate spacer 56.

The shallow trench isolation structure 20 laterally contacts, and surrounds, all sidewalls of the single crystalline semiconductor material portion 12. A horizontal interface between the shallow trench isolation structure 20 and the gate stack (60, 62) can be located between a horizontal plane including a top surface of the dielectric material portion 28 and a horizontal plane including a bottom surface of the dielectric material portion 28. A first top surface of the shallow trench isolation structure 20 can be in contact with a surface of the first doped semiconductor material portion 34, and a second top surface of the shallow trench isolation structure 20 can be in contact with a surface of the second doped semiconductor material portion 36.

The gate dielectric 60 can be in contact with sidewalls of the dielectric material portion 28. The single crystalline channel portion 32 and the dielectric material portion 28 can have a same horizontal cross-sectional shape. Each of the first and second doped semiconductor material portions (34, 36) can include a lower portion having a same width as the single crystalline semiconductor material portion 12, the dielectric material portion 28, and the single crystalline channel portion 32. Further, each of the first and second doped semiconductor material portions (34, 36) can include an upper portion having a greater width than the single crystalline semiconductor material portion 12, the dielectric material portion 28, and the single crystalline channel portion 32. The first and second doped semiconductor material portions (34, 36) can include a semiconductor material having a lattice mismatch with respect to a semiconductor material of the single crystalline semiconductor material portion 12.

Figure 11C:
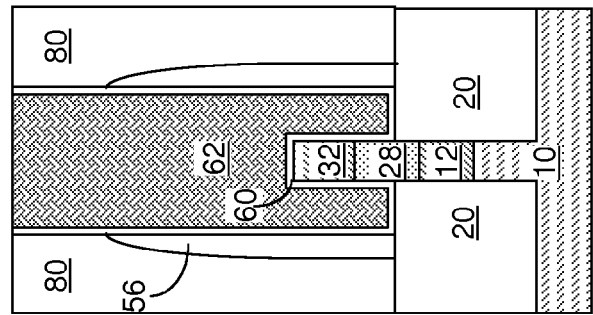
FIG. 11C is a vertical cross-sectional view of the first exemplary semiconductor structure along the vertical plane C-C' of FIG. 11A.
Figure 11A:
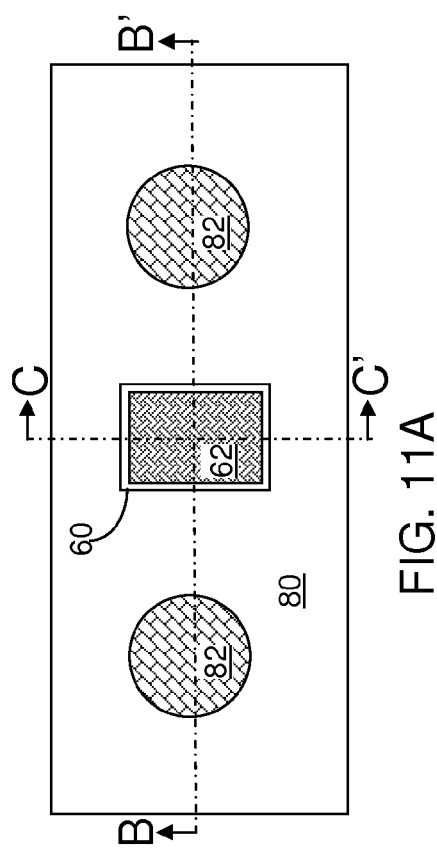
FIG. 11A is a top-down view of the first exemplary semiconductor structure after formation of contact via structures according to the first embodiment of the present disclosure.
Figure 11B:
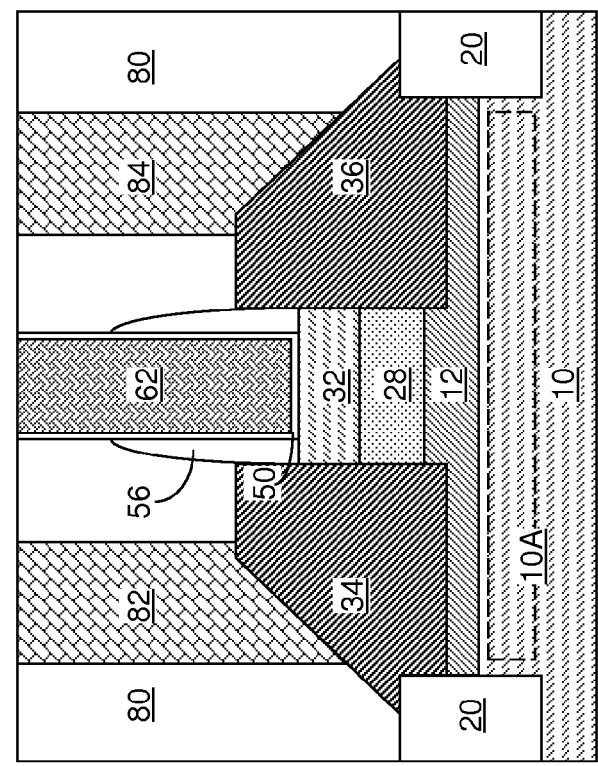
FIG. 11B is a vertical cross-sectional view of the first exemplary semiconductor structure along the vertical plane B-B' of FIG. 11A.

Referring to FIGS. 11A-11C, various contact via structures can be formed through the planarization dielectric layer 80. The various contact via structures can include a first contact via structure 82 that contacts the first doped semiconductor material portion 34 and a second contact via structure 84 that contacts the second doped semiconductor material portion 36.

The first exemplary semiconductor structure includes a field effect transistor in which the single crystalline channel portion 32 functions as a body region, one of the first and second doped semiconductor material portions (34, 36) functions as a source region, and another of the first and second doped semiconductor material portions (34, 36) functions as a drain region. The first and second doped semiconductor material portions (34, 36) can generate a longitudinal stress in the single crystalline channel portion 32 to enhance the mobility of charge carriers therein. Further, the single crystalline channel portion 32 is electrically isolated from the single crystalline semiconductor material portion 12 by the dielectric material portion 28.

Referring to FIGS. 12A-12C, a second exemplary semiconductor structure according to a second embodiment of the present disclosure is derived from the first exemplary structure of FIGS. 4A-4C by removing the disposable single crystalline semiconductor material portion 29 selective to the single crystalline channel portion 32 and the single crystalline semiconductor material portion 12. The same etch chemistries can be employed for an etch to remove the disposable single crystalline semiconductor material portion 29 as in the processing steps of FIGS. 8A-8C of the first embodiment. A cavity 159 is formed between the top surface of the single crystalline semiconductor material portion 12 and the single crystalline channel portion 32. Horizontal surfaces of single crystalline semiconductor material portion 12 are physically exposed while the disposable gate structure (50, 52) is present. Specifically, a horizontal surface of the portion of the single crystalline semiconductor material portion 12 having the first height h1 is physically exposed underneath the bottom surface of the single crystalline channel portion 32.

Referring to FIGS. 13A-13C, the cavity 159 is filled with a dielectric material portion 28. The dielectric material portion 28 includes a dielectric material such as silicon oxide, silicon nitride, silicon oxynitride, organosilicate glass (OSG), a dielectric metal oxide, or a combination thereof. The dielectric material portion 28 can be formed, for example, by depositing a dielectric material and by removing portions of the deposited dielectric material that do not underlie the single crystalline channel portion 32. In one embodiment, filling the cavity 159 can be effected by a conformal deposition of a dielectric material or by spin-coating. The removal of portions of the deposited dielectric material can be effected by recessing the deposited dielectric material employing an anisotropic etch process in which the disposable gate cap portion 54 and the gate spacer 56 are employed as an etch mask. Thus, the dielectric material portion 28 is formed above the single crystalline semiconductor material portion 12 and below the single crystalline channel portion 32. The dielectric material portion 28 vertically contacts the single crystalline semiconductor material portion 12 and the single crystalline channel portion 32. The sidewalls of the dielectric material portion 12 can be vertically coincident with the sidewalls of the single crystalline channel portion 32 and the sidewalls of the single crystalline semiconductor material portion 12.

Figure 14C:
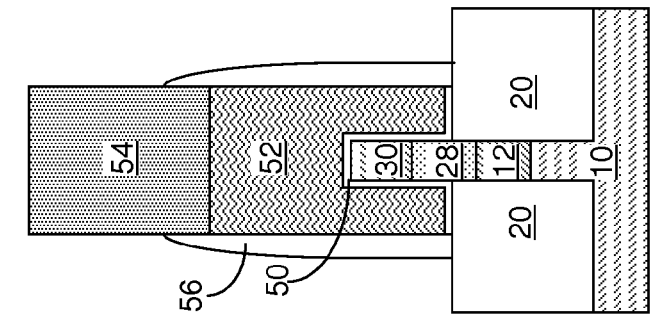
FIG. 14C is a vertical cross-sectional view of the second exemplary semiconductor structure along the vertical plane C-C' of FIG. 14A.
Figure 14A:
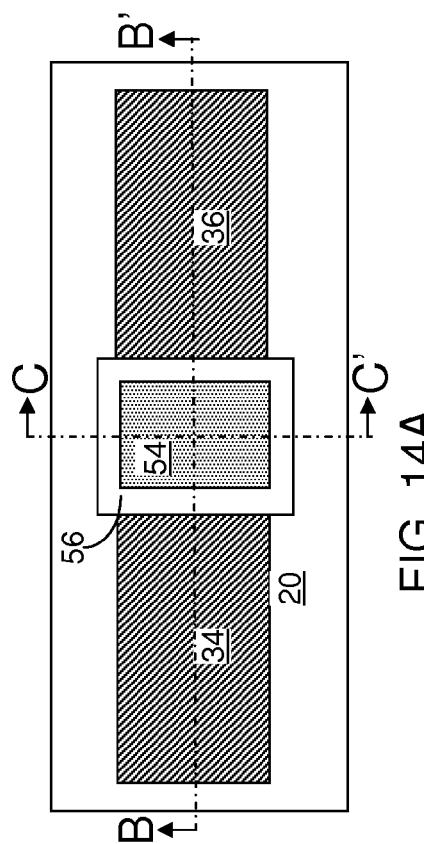
FIG. 14A is a top-down view of the second exemplary semiconductor structure after formation of a first and second doped semiconductor material portions according to the second embodiment of the present disclosure.
Figure 14B:
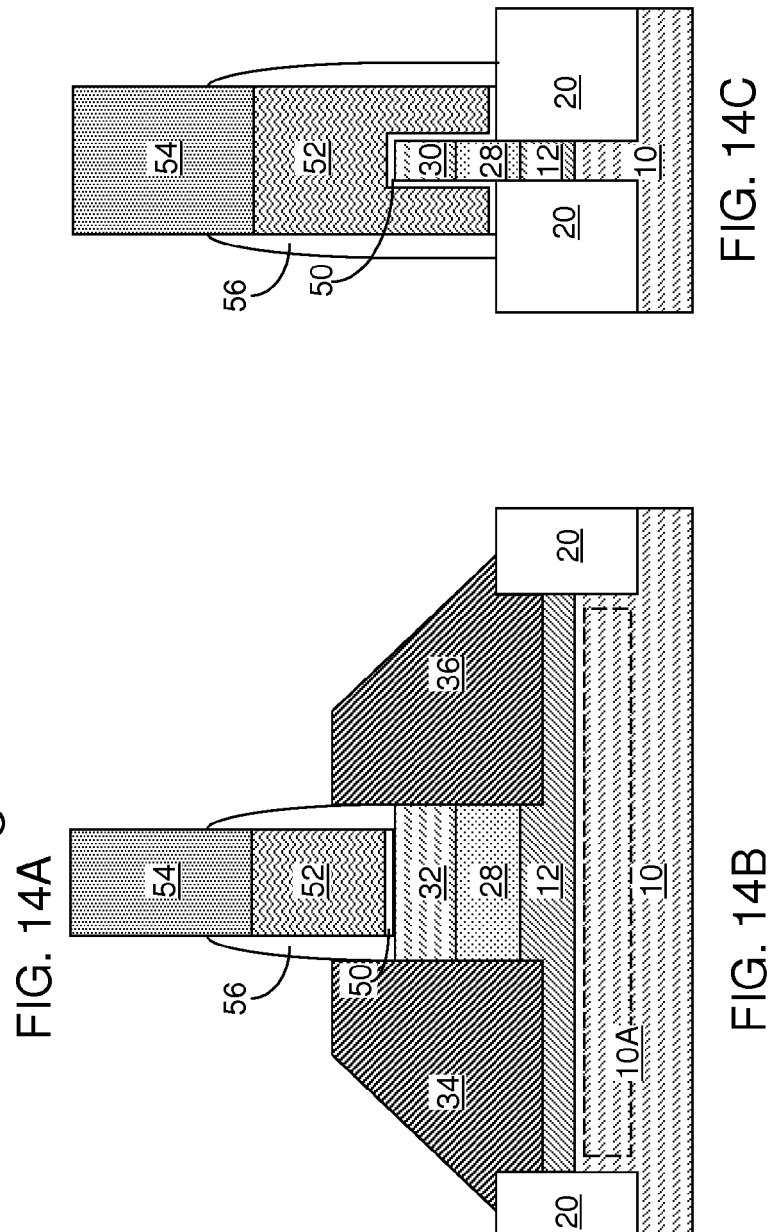
FIG. 14B is a vertical cross-sectional view of the second exemplary semiconductor structure along the vertical plane B-B' of FIG. 14A.

Referring to FIGS. 14A-14C, first and second doped semiconductor material portions (34, 36) are formed employing the same processing steps of FIGS. 5A-5C of the first embodiment. Because the dielectric material portion 28 is not single crystalline, the first and second doped semiconductor material portions (34, 36) are epitaxially aligned only with the optional single crystalline semiconductor material portion 12 and with the single crystalline channel portion 32. If the optional single crystalline semiconductor material portion 12 is not present, the first and second doped semiconductor material portions (34, 36) are epitaxially aligned only with the upper portion 10A of the semiconductor substrate layer 10 and with the single crystalline channel portion 32. A first doped semiconductor material portion 34 is in epitaxial alignment with the single crystalline semiconductor material portion 12 and the single crystalline channel portion 32. The first doped semiconductor material portion 34 is formed directly on the dielectric material portion 28. A second doped semiconductor material portion 36 is in epitaxial alignment with the single crystalline semiconductor material portion 12 and the single crystalline channel portion 32. The second doped semiconductor material portion 36 is formed directly on the dielectric material portion 28.

Referring to FIGS. 15A-15C, the processing steps of FIGS. 6A-6C and 7A-7C are performed as in the first embodiment. The resulting structure is the same as the first exemplary semiconductor structure illustrated in FIGS. 9A-9C. The processing steps of FIGS. 10A-10C and 11A-11C can be subsequently performed.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A method of forming a semiconductor structure comprising:
    forming a fin structure including a vertical stack of an upper portion of a semiconductor material layer, a single crystalline semiconductor material portion, a disposable single crystalline semiconductor material portion, and a top semiconductor portion;
    replacing end portions of said fin structure with doped semiconductor material portions that are epitaxially aligned to said single crystalline semiconductor material portion and said single crystalline channel portion;
    replacing a remainder of said disposable single crystalline semiconductor material portion with a dielectric material portion; and
    forming a gate structure straddling said single crystalline channel portion and said dielectric material portion, said gate structure including a gate dielectric and a gate electrode.

2. The method of claim 1, further comprising:
    forming a disposable gate structure straddling said fin structure;
    forming a gate spacer laterally surrounding said disposable gate structure; and
    anisotropically etching said end portions of said fin structure in areas that are not covered by said gate spacer or said disposable gate structure.

3. The method of claim 2, wherein horizontal surfaces of said single crystalline semiconductor material portion are physically exposed by said anisotropically etching of said end portions of said fin structure.

4. The method of claim 3, wherein said replacing of said end portions of said fin structure with doped semiconductor material portions comprises:
    forming a first doped semiconductor material portion in epitaxial alignment with said single crystalline semiconductor material portion and said single crystalline channel portion directly on said remainder of said disposable single crystalline semiconductor material portion; and
    forming a second doped semiconductor material portion in epitaxial alignment with said single crystalline semiconductor material portion and said single crystalline channel portion directly on said remainder of said disposable single crystalline semiconductor material portion.

5. The method of claim 4, wherein said replacing of said remainder of said disposable single crystalline semiconductor material portion with said dielectric material portion comprises:
    removing said disposable gate structure;
    removing said remainder of said disposable single crystalline semiconductor material portion; and
    forming said dielectric material portion above a remainder of single crystalline semiconductor material portion and below a remainder of said top semiconductor portion.

6. The method of claim 3, wherein said replacing of said remainder of said disposable single crystalline semiconductor material portion with said dielectric material portion comprises:
    removing said remainder of said disposable single crystalline semiconductor material portion after said horizontal surfaces of single crystalline semiconductor material portion are physically exposed and while said disposable gate structure is present; and
    forming said dielectric material portion above a remainder of single crystalline semiconductor material portion and below a remainder of said top semiconductor portion.

7. The method of claim 6, wherein said replacing of said end portions of said fin structure with doped semiconductor material portions comprises:
    forming a first doped semiconductor material portion in epitaxial alignment with said single crystalline semiconductor material portion and said single crystalline channel portion directly on said dielectric material portion; and
    forming a second doped semiconductor material portion in epitaxial alignment with said single crystalline semiconductor material portion and said single crystalline channel portion directly on said dielectric material portion.

8. The method of claim 1, wherein said disposable single crystalline semiconductor material portion comprises an n-doped single crystalline silicon, and said method further comprises removing said n-doped single crystalline silicon selective to semiconductor materials of said single crystalline semiconductor material portion and said top semiconductor portion.

9. The method of claim 1, wherein said disposable single crystalline semiconductor material portion comprises porous single crystalline silicon, and said method further comprises removing said porous single crystalline silicon selective to semiconductor materials of said single crystalline semiconductor material portion and said top semiconductor portion.

10. The method of claim 1, wherein said disposable single crystalline semiconductor material portion comprises a silicon-germanium alloy, and said method further comprises removing said silicon germanium alloy selective to semiconductor materials of said single crystalline semiconductor material portion and said top semiconductor portion.

11. The method of claim 1, wherein said dielectric material portion and said single crystalline channel portion have a same width throughout.

12. The method of claim 11, wherein said single crystalline semiconductor material portion has said same width throughout.

13. The method of claim 1, further comprising forming a shallow trench isolation structure laterally surrounding said single crystalline semiconductor material portion.

14. The method of claim 1, wherein said single crystalline semiconductor material portion comprises a center portion having a first height, and two end portions have a second height, wherein said first height is greater than said second height.

15. The method of claim 1, wherein first sidewalls of said single crystalline semiconductor material portion, said dielectric material portion, and said single crystalline channel portion in contact with said first doped semiconductor material portion are vertically coincident among one another, and second sidewalls of said single crystalline semiconductor material portion, said dielectric material portion, and said single crystalline channel portion in contact with said second doped semiconductor material portion are vertically coincident among one another.

16. The method of claim 1, wherein each of said doped semiconductor material portions includes a lower portion having a same width as said single crystalline semiconductor material portion, said dielectric material portion, and said single crystalline channel portion, and an upper portion having a greater width than said single crystalline semiconductor material portion, said dielectric material portion, and said single crystalline channel portion.

17. The method of claim 1, wherein said doped semiconductor material portions include a semiconductor material having a lattice mismatch with respect to a semiconductor material of said single crystalline semiconductor material portion.

18. The method of claim 1, wherein said disposable single crystalline semiconductor material portion comprised a silicon-germanium alloy having a germanium concentration greater than 20%, and said removing of said disposable single crystalline semiconductor material portion is performed by an etch chemistry that etches a silicon-germanium alloy having a germanium concentration greater than 20% selective to a semiconductor material having a lesser concentration of germanium.

* * * * *